US007892611B2

(12) United States Patent
Swallow et al.

(10) Patent No.: US 7,892,611 B2
(45) Date of Patent: Feb. 22, 2011

(54) PLASMA GENERATING ELECTRODE ASSEMBLY

(75) Inventors: Frank Swallow, Garryvoe (IE); Peter Dobbyn, Midleton (IE)

(73) Assignee: Dow Corning Ireland Limited, Midleton, Co. Cork (IE)

(*) Notice: Subject to any disclaimer, the term of this patent is extended or adjusted under 35 U.S.C. 154(b) by 0 days.

(21) Appl. No.: 12/274,984

(22) Filed: Nov. 20, 2008

(65) Prior Publication Data

US 2011/0006039 A1 Jan. 13, 2011

Related U.S. Application Data

(62) Division of application No. 10/543,715, filed on Jul. 28, 2005, now abandoned.

(30) Foreign Application Priority Data

Jan. 31, 2003 (GB) ................................ 0302265.4
Feb. 24, 2003 (GB) ................................ 0304094.6
Jan. 28, 2004 (WO) ................ PCT/EP2004/001756

(51) Int. Cl.
*C23C 16/00* (2006.01)
(52) U.S. Cl. .................................. 427/569; 118/723 E
(58) Field of Classification Search ....................... None
See application file for complete search history.

(56) References Cited

U.S. PATENT DOCUMENTS 3,707,024 A * 12/1972 Mayer et al. .................. 28/247
3,899,685 A 8/1975 Francis et al.
4,130,490 A 12/1978 Flamm et al.
4,813,488 A 3/1989 Thurer
4,834,948 A 5/1989 Schmiga et al.
4,976,098 A 12/1990 Meyer et al.
4,999,136 A 3/1991 Su et al.
5,185,132 A 2/1993 Horiike et al.
5,387,775 A 2/1995 Kang
5,414,324 A 5/1995 Roth et al.
5,820,541 A 10/1998 Berlanga Barrera (Continued)

FOREIGN PATENT DOCUMENTS

CN 1060117 A 4/1992

(Continued)

OTHER PUBLICATIONS

English language abstract for CN 1060117 extracted from espacenet.com database, dated Sep. 9, 2007.

(Continued)

*Primary Examiner*—Timothy H Meeks
*Assistant Examiner*—Joseph Miller, Jr.
(74) *Attorney, Agent, or Firm*—Howard & Howard Attorneys PLLC

(57) ABSTRACT

A plasma glow discharge and/or dielectric barrier discharge generating assembly (1) comprising at least one pair of substantially equidistant spaced apart electrodes (2), the spacing between the electrodes being adapted to form a plasma zone (8) upon the introduction of a process gas and enabling passage, where required, of gaseous, liquid and/or solid precursor(s) characterized in that at least one of the electrodes (2) comprises a housing (20) having an inner (5) and outer (6) wall, wherein the inner wall (5) is formed from a non-porous dielectric material, and which housing (20) substantially retains an at least substantially non-metallic electrically conductive material.

24 Claims, 8 Drawing Sheets

U.S. PATENT DOCUMENTS

| | | | | |
|---|---|---|---|---|
| 6,232,723 | B1 | 5/2001 | Alexeff | |
| 6,489,585 | B1 | 12/2002 | Nakamura et al. | |
| 2001/0005032 | A1 | 6/2001 | Aigner et al. | |
| 2001/0024486 | A1 | 9/2001 | Herbert | |
| 2002/0170676 | A1* | 11/2002 | Mitrovic et al. | 156/345.47 |
| 2003/0095898 | A1 | 5/2003 | Usui et al. | |
| 2004/0020598 | A1 | 2/2004 | Itatani et al. | |

FOREIGN PATENT DOCUMENTS

| | | | |
|---|---|---|---|
| CN | 1379144 | A | 11/2002 |
| EP | 0240648 | A1 | 10/1987 |
| EP | 0431951 | A2 | 6/1991 |
| EP | 1297891 | A1 | 4/2003 |
| JP | 63098958 | A | 4/1988 |
| JP | 3188285 | A | 8/1991 |
| JP | 07220895 | A | 8/1995 |
| JP | 09141087 | A | 6/1997 |
| JP | 11031608 | A | 2/1999 |
| JP | 2001035835 | A | 2/2001 |
| RU | 2159520 | C1 | 11/2000 |
| WO | WO 0228548 | A2 | 4/2001 |
| WO | WO 0140359 | A1 | 6/2001 |
| WO | WO 0191896 | A1 | 12/2001 |
| WO | WO 0235576 | A1 | 5/2002 |
| WO | WO 03086031 | A1 | 10/2003 |

OTHER PUBLICATIONS

English language abstract for CN 1379144 extracted from espacenet.com database, dated Sep. 9, 2007.

English equivalent for EP0240648 extracted from espacenet.com database, dated Mar. 16, 2009.

English language abstract for JP 63098958 extracted from espacenet.com database, dated Jun. 23, 2006.

English language abstract for JP3188285 extracted from espacenet.com database, dated Mar. 16, 2009.

English language translation and abstract for JP 07220895 extracted from PAJ database, dated Mar. 16, 2009, 31 pages.

English language translation and abstract for JP 09141087 extracted from PAJ database, dated Mar. 16, 2009, 32 pages.

English language translation and abstract for JP 11031608 extracted from PAJ database, dated Mar. 16, 2009, 19 pages.

English language translation and abstract for JP 2001035835 extracted from PAJ database, dated Mar. 16, 2009, 39 pages.

English language abstract for RU 2159520 extracted from Delphion.com database, dated Feb. 25, 2009.

English language abstract for WO 0191896 extracted from espacenet.com database, dated Mar. 30, 2009.

Kanazawa et al. "Stable Glow Plasma at Atmospheric Pressure", J. Phys. D: Appl. Phys. No. 21, 1988, pp. 838-840.

Kanazawa et al. "Glow Plasma Treatment at Atmospheric Pressure For Surface Modification and Film Deposition", Nuclear Instruments and Methods in Physics Research, No. B37/38, 1989, pp. 842-845.

Okazaki et al, "Glow Discharge Plasma at Atmospheric Pressure and its Application", Proc. Jpn. Symp. Plasma Chem. vol. 2, 1989, pp. 95-102.

Yokoyama et al. "The Improvement of the Atmospheric-Pressure Glow Plasma Method and the Deposition of Organic Films", J. Phys. D: Appl. Phys., No. 23, 1990, pp. 374-377.

* cited by examiner

FIG. 1
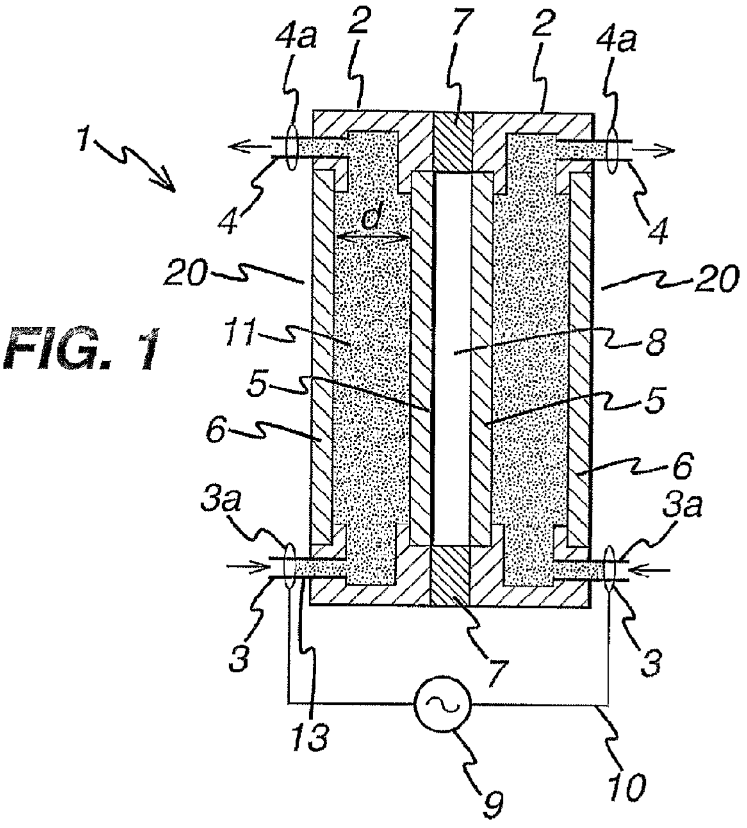
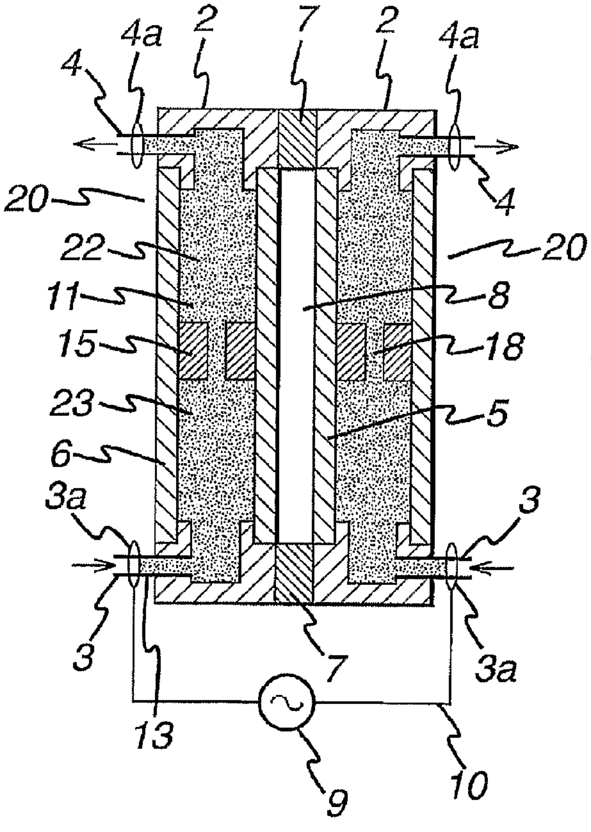
FIG. 2

FIG. 3
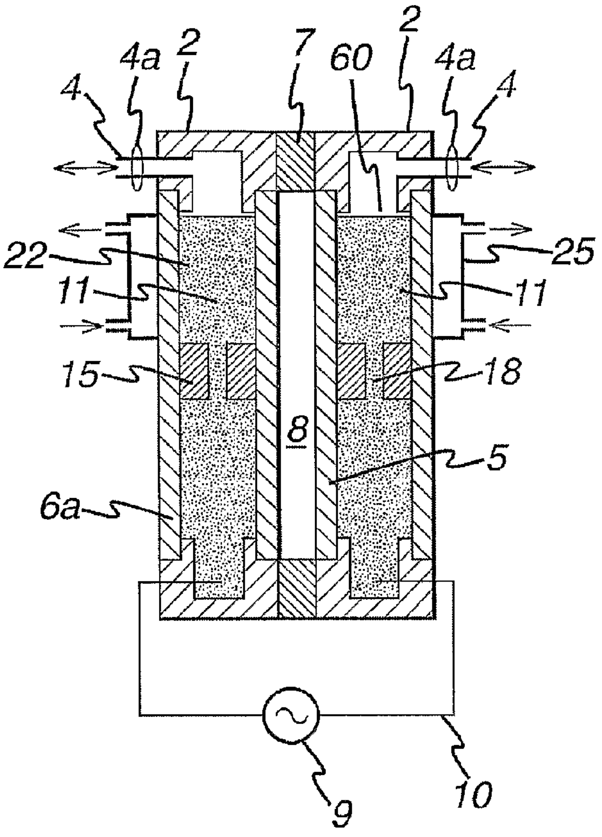
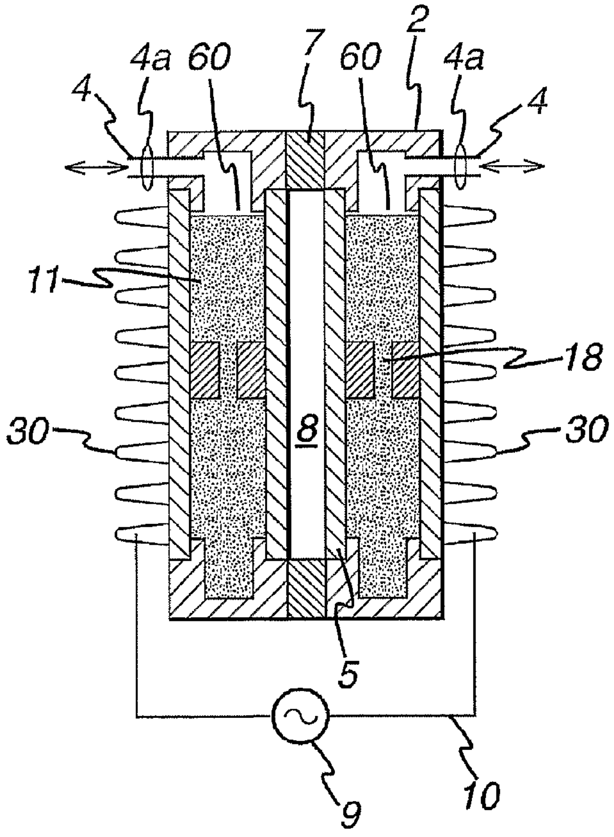
FIG. 4

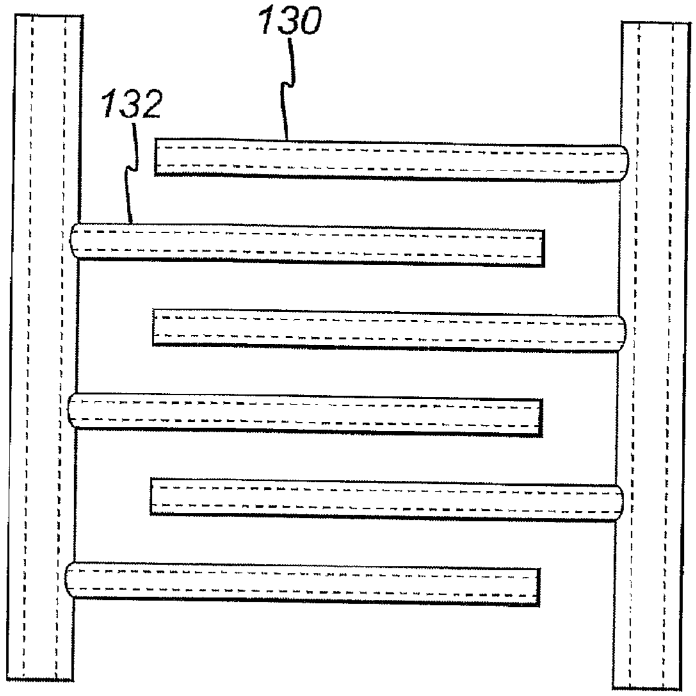
FIG. 10
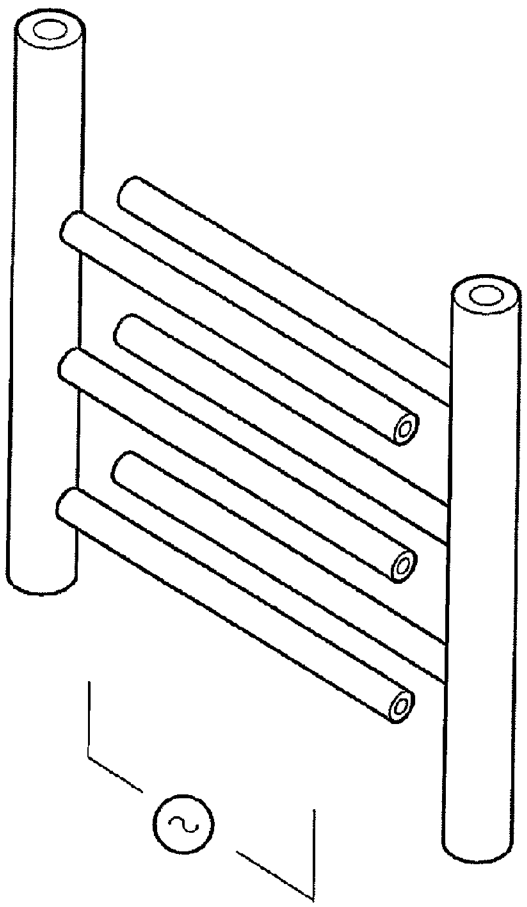

PLASMA GENERATING ELECTRODE ASSEMBLY

CROSS-REFERENCE TO RELATED APPLICATIONS

The present application is a divisional of U.S. Ser. No. 10/543,715 filed on Jul. 28, 2005, which claims priority to and all advantages of International Application No. PCT/EP04/01756 filed on Jan. 28, 2004, which claims priority to and all advantages of British Application Nos. GB 0302265.4 and GB 0304094.6, filed on Jan. 31, 2003 and Feb. 24, 2003, respectively.

The present invention relates to a plasma generating assembly comprising at least one pair of spaced apart electrodes, at least one of which is substantially non-metallic.

When matter is continually supplied with energy, its temperature increases and it typically transforms from a solid to a liquid and, then, to a gaseous state. Continuing to supply energy causes the system to undergo a further change of state in which neutral atoms or molecules of the gas are broken up by energetic collisions to produce negatively charged electrons, positive or negatively charged ions and other species. This mix of charged particles exhibiting collective behaviour is called "plasma". Due to their electrical charge, plasmas are highly influenced by external electromagnetic fields which make them readily controllable. Furthermore, their high energy content allows them to achieve processes which are impossible or difficult through the other states of matter, such as by liquid or gas processing.

The term "plasma" covers a huge range of systems whose density and temperature vary by many orders of magnitude. Some plasmas are very hot and all their microscopic species (ions, electrons, etc.) are in approximate thermal equilibrium, the energy input into the system being widely distributed through atomic/molecular level collisions. Other plasmas, however, particular those at low pressure (e.g. 100 Pa) where collisions are relatively infrequent, have their constituent species at widely different temperatures and are called "non-thermal equilibrium" plasmas. In these non-thermal plasmas, the free electrons are very hot with temperatures of many thousands of degrees Kelvin whilst the neutral and ionic species remain cool. Because the free electrons have almost negligible mass, the total system heat content is low and the plasma operates close to room temperature thus allowing the processing of temperature sensitive materials, such as plastics or polymers, without imposing a damaging thermal burden onto the sample. However, the hot electrons create, through high energy collisions, a rich source of radicals and excited species with a high chemical potential energy capable of profound chemical and physical reactivity. It is this combination of low temperature operation plus high reactivity which makes non-thermal plasmas technologically important and a very powerful tool for manufacturing and material processing, capable of achieving processes which, if achievable at all without plasma, would require very high temperatures or noxious and aggressive chemicals.

For industrial applications of plasma technology, a convenient method is to couple electromagnetic power into a volume of process gas which can be mixtures of gases and vapours in which the work pieces/samples to be treated are immersed or passed through. This is achieved by passing a process gas (e.g. helium) through a gap between adjacent electrodes across which a large potential difference has been applied. A plasma is formed in the gap (hereafter referred to as the plasma zone) by the excitement of the gaseous atoms and molecules caused by the effects of the potential difference between the electrodes. The gas becomes ionised in the plasma generating chemical radicals, UV-radiation, excited neutrals and ions which react with the surface of the samples. The glow generally associated with plasma generation is caused by the excited species giving off light when returning to a less excited state. By correct selection of process gas composition, driving power frequency, power coupling mode, pressure and other control parameters, the plasma process can be tailored to the specific application required by the manufacturer.

Because of the huge chemical and thermal range of plasmas, they are suitable for many technological applications, which are being continually extended. Non-thermal equilibrium plasmas are particularly effective for surface activation, surface cleaning, material etching and coating of surfaces.

The surface activation of polymeric materials is a widely used industrial plasma technology pioneered by the automotive industry. Thus, for example, polyolefins, such as polyethylene and polypropylene, which are favoured for their recycling purposes, have a non-polar surface and consequent poor disposition to coating or adhesion. However, treatment by oxygen plasma results in the formation of surface polar groups giving high wettability, and consequently, excellent coverage and adhesion to metals, paints, adhesives or other coatings. Thus, for example, plasma surface engineering is essential to the manufacture of vehicle fascias, dashboards, bumpers etc. and to component assembly in the toy, etc. industries. Many other applications are available in the printing, painting, adhesion, laminating and general coating of components of all geometries in polymer, plastic, ceramic/inorganic, metal and other materials.

The increasing pervasiveness and strength of environmental legislation world-wide is creating substantial pressure on industry to reduce or eliminate the use of solvents and other wet chemicals in manufacturing, particularly for component/surface cleaning. In particular, CFC-based degreasing operations have been largely replaced by plasma cleaning technology operating with oxygen, air and other non-toxic gases. Combining water based pre-cleaning with plasma allows even heavily soiled components to be cleaned and surface qualities obtained are typically superior to those resulting from traditional methods. Any organic surface contamination is rapidly scavenged by room temperature plasma and converted to gaseous $CO_2$ and water, which can be safely exhausted.

Plasmas can also be used for the etching of bulk materials, i.e. for the removal of unwanted materials therefrom. Thus, for example, oxygen based plasma will etch polymers, a process used in the production of circuit boards, etc. Different materials such as metals, ceramics and inorganics are etched by careful selection of precursor gas and attention to the plasma chemistry. Structures down to nanometre critical dimension are now being produced by plasma etching technology.

A plasma technology that is rapidly emerging into mainstream industry is that of plasma coating/thin film deposition. Typically, a high level of polymerisation is achieved by application of plasma to monomeric gases and vapours. Thus, a dense, tightly knit and three-dimensionally connected film can be formed which is thermally stable, chemically very resistant and mechanically robust. Such films are deposited conformally on even the most intricate of surfaces and at a temperature, which ensures a low thermal burden on the substrate. Plasmas are therefore ideal for the coating of delicate and heat sensitive, as well as robust materials. Plasma coatings are free of micropores even with thin layers. The optical properties, e.g. colour, of the coating can often be customised and plasma coatings adhere well to even non-polar materials, e.g. polyethylene, as well as steel (e.g. anti-corrosion films on metal reflectors), ceramics, semiconductors, textiles, etc.

In all these processes, plasma engineering produces a surface effect customised to the desired application or product without affecting the material bulk in any way. Plasma processing thus offers the manufacturer a versatile and powerful tool allowing choice of a material for its bulk technical and commercial properties while giving the freedom to independently engineer its surface to meet a very different set of needs. Plasma technology thus confers greatly enhanced product functionality, performance, lifetime and quality and gives the manufacturing company significant added benefit to its production capability.

These properties provide a strong motivation for industry to adopt plasma-based processing, and this move has been led since the 1960s by the microelectronics community which has developed the low pressure Glow Discharge plasma into an ultra-high technology and high capital cost engineering tool for semiconductor, metal and dielectric processing. The same low pressure Glow Discharge type plasma has increasingly penetrated other industrial sectors since the 1980s offering, at more moderate cost, processes such as polymer surface activation for increased adhesion/bond strength, high quality degreasing/cleaning and the deposition of high performance coatings. Thus, there has been a substantial take-up of plasma technology. Glow discharges can be achieved at both vacuum and atmospheric pressures. In the case of atmospheric pressure glow discharge, gases such as helium or argon are utilised as diluents (process gases) and a high frequency (e.g. >1 kHz) power supply is used to generate a homogeneous glow discharge at atmospheric pressure via a Penning ionisation mechanism, (see for example, Kanazawa et al, J. Phys. D: Appl. Phys. 1988, 21, 838, Okazaki et al, Proc. Jpn. Symp. Plasma Chem. 1989, 2, 95, Kanazawa et al, Nuclear Instruments and Methods in Physical Research 1989, B37/38, 842, and Yokoyama et al., J. Phys. D: Appl. Phys. 1990, 23, 374).

However, adoption of plasma technology has been limited by a major constraint on most industrial plasma systems, namely, their need to operate at low pressure. Partial vacuum operation means a closed perimeter, sealed reactor system providing only off-line, batch processing of discrete work pieces. Throughput is low or moderate and the need for vacuum adds capital and running costs.

Atmospheric pressure plasmas, however, offer industry open port or perimeter systems providing free ingress into and exit from the plasma zone by webs and, hence, on-line, continuous processing of large or small area webs or conveyor-carried discrete webs. Throughput is high, reinforced by the high species flux obtained from high pressure operation. Many industrial sectors, such as textiles, packaging, paper, medical, automotive, aerospace, etc., rely almost entirely upon continuous, on-line processing so that open port/perimeter configuration plasmas at atmospheric pressure offer a new industrial processing capability.

Corona and flame (also a plasma) treatment systems have provided industry with a limited form of atmospheric pressure plasma processing capability for about 30 years. However, despite their ease of manufacture, these systems have failed to be used on a large scale at an industrial level. This is because corona/flame systems have significant limitations. They operate in ambient air offering a single surface activation process and have a negligible effect on many materials and a weak effect on most. The treatment is often non-uniform and the corona process is incompatible with thick webs or 3D webs while the flame process is incompatible with heat sensitive substrates. It has become clear that atmospheric pressure plasma technology must move much deeper into the atmospheric pressure plasma spectrum to develop advanced systems meeting industry needs.

Significant advances have been made in plasma deposition at atmospheric pressure. Considerable work has been done on the stabilisation of atmospheric pressure glow discharges, described in "Appearance of stable glow discharge in air, argon, oxygen and nitrogen at atmospheric pressure using a 50 Hz source" by Satiko Okazaki, Masuhiro Kogoma, Makoto Uehara and Yoshihisa Kimura, J. Phys. D: Appl. Phys. 26 (1993) 889-892. Further, there is described in U.S. Pat. No. 5,414,324 (Roth et al) the generation of a steady-state glow discharge plasma at atmospheric pressure between a pair of insulated metal plate electrodes spaced up to 5 cm apart and radio frequency (R.F). energised with a root mean square (rms) potential of 1 to 5 kV at 1 to 100 kHz. U.S. Pat. No. 5,414,324 discusses the use of electrically insulated metallic plate electrodes and the problems observed when using electrode plates as well as the need to discourage electrical breakdown at the tips of electrodes. It further describes the use of the electrodes in the form of copper plates and a water cooling system, which is supplied through liquid flow conduits bonded to the electrodes and as such, water does not come into direct contact with any electrode surface.

In U.S. Pat. No. 5,185,132, there is described an atmospheric plasma reaction method in which metallic plate electrodes are used in a vertical configuration. However, they are merely used in the vertical configuration to prepare the plasma and then the plasma is directed out from between the plates onto a horizontal surface below the vertically arranged electrodes.

In EP 0431951 an atmospheric plasma assembly is provided for treating substrates with species produced by plasma treating a noble gas/reactive gas mixture. Metallic electrodes at least partially coated in dielectrics are positioned parallel to each other and are vertically aligned such that they are perpendicular to substrate which passes beneath a slit between electrodes. The assembly requires an integral surface treatment unit which effectively restricts the width of any substrate to be treated by the width of the surface treatment unit and as such renders the system cumbersome.

One major problem encountered when using metal plate and/or mesh type electrodes coated in or adhered to dielectric materials is the problem of conformity between the electrode surface and the dielectric. It is almost impossible to ensure complete conformity between even a small metallic plate and a dielectric because of surface blemishes on the surface of one or other but particularly the metal surface. It is therefore exceptionally difficult to construct electrodes of this type suitable for industrial applications, which has been a major problem in the development of atmospheric plasma processes on an industrial scale.

WO 02/35576 describes the use of metallic electrodes attached to the rear faces of vertical dielectric plates, upon which a liquid of limited conductivity is sprayed to provide the dual functions of thermal management and electrode passivation. The use of a partially conductive liquid such as water can help mitigate the micro-discharges that can result from rough "high spots" on the metallic surface and can also improve conformity of the metallic electrode to the dielectric surface by providing a partially conductive path across the gap between a poorly conforming electrode and the dielectric. The partially conductive water has the effect of smoothing out the electrical surface at the dielectric and so creates a near homogenous surface potential. This technique suffers from the complexity of constructing a suitable spray distribution system and the difficulty of ensuring sufficient and even drainage of the water from each electrode assembly.

While the use of cooling water in direct contact with metal electrodes reduces inhomogeneities, it does not eliminate them but may significantly increase the complexity and cost of the required plasma equipment. It is difficult to engineer a perfect metallic electrode that has neither residual surface roughness nor edge burring and that can be securely and intimately attached to a large dielectric surface. The use of a partially conductive liquid such as water can help mitigate the micro-discharges that can result from rough "high spots" on the metallic surface and can also improve conformity of the metallic electrode to the dielectric surface by providing a partially conductive path across the gap between a poorly conforming electrode and the dielectric. The partially conductive water has the effect of smoothing out the electrical surface at the dielectric and so creates a near homogenous surface potential.

Water electrodes have previously been described in the literature as a source to generate direct current (D.C.) arc plasma between an electrode and a water surface or column. For example P. Andre et al. (J. of Physics D: Applied Physics (2001) 34(24), 3456-3465 describe the generation of a D.C. discharge between two columns of running water.

A. B. Saveliev and G. J. Pietsch (Hakone VIII Conference Proceedings—International Symposium on High Pressure, Low Temperature Plasma Chemistry, Jul. 21-25 2002, Pühajärve, Estonia.) also describe the application of a water electrode to generate a surface discharge. A surface discharge differs from the parallel plate glow discharge described above as the device consists of a flat electrode attached to a dielectric with a rod-like surface electrode in direct contact with the face of the dielectric material, the discharge then exists as a point discharge along the dielectric surface. In the example described by Saveliev, the water electrode is used primarily to provide a transparent electrode.

T. Cserfavi et al. (J. Phys. D: Appl. Phys. 26, 1993, 2184-2188) describe generating a discharge which they describe as glow discharge between a metal anode and the surface of an open container of water acting as the cathode. However, this is not a glow discharge as defined above as no dielectric is placed between the electrodes and as such what would be seen in such a system is a discharge which "jumps" between the metal electrode and the water surface. The discharge in the air gap between water surface and anode is analysed by optical emission spectroscopy to determine nature of dissolved salts within the water.

In U.S. Pat. No. 6,232,723, porous non-metallic electrodes have been used to produce a plasma by dispersing a conducting fluid throughout the pores of the non-metallic electrodes. The fact that no dielectric material is seemingly placed between the electrodes however, suggest that problems due to shorting between the electrodes might occur.

Flow through systems utilising electrodes made from dielectric materials through which conducting liquids are passed have been described in U.S. Pat. No. 4,130,490 and JP 07-220895. U.S. Pat. No. 4,130,490 describes a means for the removal by oxidation of contaminants from air or oxygen atmospheres which comprises an inner metallic tubular electrode through which a coolant such as water flows to and from a coolant reservoir remote from the electrode. The outer electrode comprises a housing of a dielectric material having an inlet and outlet through which an electrically conducting liquid coolant is passed to and from a reservoir. The gap between the electrodes defines a gas chamber in which contaminants are oxidised.

The present application seeks to utilise a conductive media which conforms to the dielectric surface, such that the previously required metallic electrodes can be eliminated, which will result in a homogenous electrically charged dielectric surface and thermal management of heat generated by the plasma using a conductive medium that demonstrates long-term adherence/contact to the inner and outer wall interfaces therewith.

In accordance with the present invention there is provided a plasma glow discharge and/or dielectric barrier discharge generating assembly comprising at least one pair of substantially equidistant spaced apart electrodes, the spacing between the electrodes being adapted to form a plasma zone upon the introduction of a process gas and enabling passage, where required, of gaseous, liquid and/or solid precursor(s) characterized in that at least one of the electrodes comprises a housing having an inner and outer wall, wherein at least the inner wall is formed from a non-porous dielectric material, and which housing substantially retains an at least substantially non-metallic electrically conductive material.

It is to be understood that the plasma zone is the region between facing walls (hereafter referred to as inner walls) of adjacent pairs of electrodes in which a plasma may be generated upon the application of a potential difference between the electrodes.

Preferably each electrode comprises a housing having an inner and outer wall, wherein at least the inner wall is formed from a dielectric material, and which housing contains an at least substantially non-metallic electrically conductive material in direct contact with the inner wall instead of the "traditional" metal plate or mesh. Electrodes of this type are preferred because the inventors have identified that by using electrodes in accordance with the present invention to generate a Glow Discharge, the resulting homogeneous glow discharge can be generated with reduced inhomogeneities when compared to systems utilizing metal plate electrodes. A metal plate is never fixed directly to the inner wall of an electrode in the present invention and preferably, the non-metallic electrically conductive material is in direct contact with the inner wall of the electrode.

The dielectric materials used in accordance with the present invention may be made from any suitable dielectric, examples include but are not restricted to polycarbonate, polyethylene, glass, glass laminates, epoxy filled glass laminates and the like. Preferably, the dielectric has sufficient strength in order to prevent any bowing or disfigurement of the dielectric by the conductive material in the electrode. Preferably, the dielectric used is machinable and is provided at a thickness of up to 50 mm in thickness, more preferably up to 40 mm thickness and most preferably 15 to 30 mm thickness. In instances where the selected dielectric is not sufficiently transparent, a glass or the like window may be utilized to enable diagnostic viewing of the generated plasma.

The electrodes may be spaced apart by means of a spacer or the like, which is preferably also made from a dielectric material which thereby effects an increase in the overall dielectric strength of the system by eliminating any potential for discharge between the edges of the conductive liquid.

Electrode pairs in accordance with the assembly of the present invention may be of any suitable geometrical shape and size. Clearly the simplest geometry are parallel plates which can be over 1 $m^2$ surface area in size thereby having the ability to form large scale plasma zones suitable for industrial plasma treating applications for webs or the like, but they may alternatively be in the form of concentric pipes or be tubular or the like for treatment of powders and liquids or the like.

The substantially non-metallic electrically conductive material may be a liquid such as a polar solvent for example water, alcohol and/or glycols or aqueous salt solutions and mixtures thereof, but is preferably an aqueous salt solution. When water is used alone, it preferably comprises tap water or mineral water. Preferably, the water contains up to a maximum of about 25% by weight of a water soluble salt such as an alkali metal salt, for example sodium or potassium chloride or alkaline earth metal salts. Increasing the conductivity of the liquid using the aforementioned ionic salts decreases significantly the number of inhomogeneities thereby rendering prior art metallic plate electrodes superfluous. This is because the conductive material present in an electrode of the present invention has substantially perfect conformity and thereby a perfectly homogeneous surface potential at the dielectric surface, a feature which may be observed in use because the plasmas effected by the electrodes of the present invention give a more even glow without darker areas which indicate weak plasma formation. This is further supported by the fact that localized point discharges are not observed in plasma generated between electrodes described herein. Varying the type and concentration of ionic species in the conductive liquid easily controls the capacitance and impedance of the electrodes of the present invention. Such control can be exploited to reduce the demands upon any impedance matching circuitry used in the RF generator and transformer system utilized to generate the plasma between the electrodes.

If the at least substantially non-metallic electrically conductive material used in an electrode of the present invention is a polar solvent such as water, alcohol and/or glycols or aqueous salt solutions within a dielectric containment, the electrode may be transparent, dependent on the chosen dielectric, thereby enabling easy access for optical diagnostics, while the substantially non-metallic electrically conductive material itself contributes to removal of thermal load from plasma apparatus such as glow discharge apparatus. This greatly simplifies the problem of heat removal whilst also improving electrode coverage and hence electrical passivation, when comparing the present invention with the spraying process described in WO02/35576. The use of a conductive liquid further enhances the homogeneity of the electrical potential at the dielectric face by ensuring constant charge distribution whereas the conformity of a metallic electrode to the dielectric face cannot be ensured. The conformity of the conducting liquid enables constant and intimate contact thereof to the surfaces of the inner and/or outer walls of the electrode.

Alternatively, the substantially non-metallic electrically conductive material may be in the form of one or more conductive polymer compositions, which may typically be supplied in the form of pastes. Such pastes are currently used in the electronics industry for the adhesion and thermal management of electronic components, such as microprocessor chip sets. These pastes typically have sufficient mobility to flow and conform to surface irregularities.

Suitable polymers for the conductive polymer compositions in accordance with the present invention may include silicones, polyoxypolyeolefin elastomers, a hot melt based on a wax such as a, silicone wax, resin/polymer blends, silicone polyamide copolymers or other silicone-organic copolymers or the like or epoxy, polyimide, acrylate, urethane or isocyanate based polymers. The polymers will typically contain conductive particles, typically of silver but alternative conductive particles might be used including gold, nickel, copper, assorted metal oxides and/or carbon including carbon nanotubes; or metallised glass or ceramic beads. Specific examples polymers which might be used include the conductive polymer described in EP 240648 or silver filled organopolysiloxane based compositions such as Dow Corning® DA 6523, Dow Corning® DA 6524, Dow Corning® DA 6526 BD, and Dow Corning® DA 6533 sold by Dow Corning Corporation or silver filled epoxy based polymers such as Ablebond® 8175 from (Ablestik Electronic Materials & Adhesives) Epo-TeK® H20E-PFC or Epo-Tek® E30 (Epoxy Technology Inc).

As mentioned above a major advantage of the present invention is conformity, by using a liquid/paste to ensure a constant and intimate contact/adherence thereof to the interfaces with the inner and outer walls of the electrode. Whilst contact/adherence may be obtained by the use of a flowable medium such as a liquid or paste, it may also be obtained by physical adhesion to both the surfaces of the inner and outer walls of the electrode by a conductive medium that can absorb mechanical and thermal stresses at those surfaces that would lead to de-lamination. As such, an adhesive elastomer with both thermal and electrically conductive properties could be used as the medium between the surfaces of the inner and outer walls of the electrode. A conductive paste can be applied to a dielectric surface and chemically bonded to form an elastomeric, conductive medium that would conduct both electrically and thermally, whilst providing structural strength through the bonding of the dielectric to the structural constraining plate, and that would also absorb stresses that might lead to de-lamination of more rigid adhesives. One major advantage of the conformity aspect of the present invention is the opportunity provided to manufacture electrodes with large surface areas, by using a liquid/paste to ensure a constant and intimate contact/adherence thereof to the interfaces with the inner and outer walls of the electrode. This is a major advantage with respect to industrial sized applications where electrode systems with large surface areas are required in order to treat industrial scale substrates at appropriate rates.

This electrode assembly may for example comprise an inner wall made from a dielectric material onto which is bonded a composite electrode comprising a metallic heat sink, which provides overall structural integrity, between which there is provided a thermally and electrically conductive, filled elastomer that forms an adhesive, flexible interface.

Heat removal is a major problem in plasma assemblies, particularly for those using metal plate type electrodes. However, this problem is significantly reduced in electrodes as described above because of the effect of the convection of heat through the liquid. Furthermore, electrical high spots are removed through convection of the conductive liquid. It is envisaged, when using one or more electrodes as discussed above that heat generated by the electrodes may be dissipated by for example utilisation of cooling coils and utilizing the outer wall of the electrode as a means of removing heat therefrom and therefore the outer wall is preferably made from a suitable heat sink. The heat sink is preferably metallic in form and may comprise outwardly projecting fins and may use cooling fluids, typically air or an external cooling coil to enhance the cooling process One of the major problems currently encountered with plasma systems such as atmospheric pressure glow discharge systems utilising metallic plate electrodes is that there is no way of varying the path length of a substrate through an activated plasma zone without physically replacing the electrodes. Whilst one solution may be the variation of time in which a substrate is resident in the plasma zone by varying the speed of a substrate passing therethrough, electrodes of the type described above provide a simpler solution. Preferably each electrode, utilising a polar solvent for example water, alcohol and/or glycols or aqueous salt solutions and mixtures thereof, comprises an inlet and more preferably an inlet and outlet. The inlet and outlet may both comprise valves to enable the introduction and removal of a polar solvent for example water, alcohol and/or glycols or aqueous salt solutions and mixtures thereof. The valves may comprise any suitable form and are particularly used as a means of varying the path length and as such plasma treatment zone through which a substrate is passed. By having the valved inlet and outlet the path length of the electrode system may be easily varied by either, opening the outlet valve and the inlet valve and allowing liquid to exit through the outlet but preventing liquid entering the inlet, or by introducing more liquid by opening the inlet valve and introducing a previously determined amount of liquid to increase the effective size of the electrode. This in turn also means that the user is better able to control the plasma reaction time for a substrate being plasma treated using one or more electrodes of the present invention, particularly in cases where the relative speed of substrate through the plasma zone is difficult to vary.

The avoidance of the need to continuously circulate a polar solvent for example water, alcohol and/or glycols or aqueous salt solutions and mixtures thereof through the electrode system to and from a reservoir or the like as taught in U.S. Pat. No. 4,130,490 and JP 07-220895 means that the complexity of the equipment required for electrode systems in accordance with the present invention is significantly reduced as means for the continuous flow through are no longer required.

Each electrode in accordance with the present invention may be segmented by the use of support ribs which are designed to substantially divide the housing into two or more sections. This segmentation offers an additional advantage, in the form of assisting in the variability of plasma zone path length, for example if electrical continuity is not established between the different segments each individual segment will operate as an individual electrode so that the path length of the plasma zone may be readily altered and optimised for the required purpose. The Support ribs may be attached to either or both of the inner and outer walls and provision for electrical continuity is maintained by means of a wired connection or, where a conductive liquid is in use, by the presence of continuous conductive liquid pathways between the sections. By securing the inner and outer walls to the support ribs the area over which maximum pressure caused by the internal pressures from the substantially non-metallic electrically conductive material is reduced, thereby reducing forces, which potentially could cause distortion of the inner and/or outer walls. The path length of the plasma zone caused by the introduction the support ribs may be readily altered and optimised.

One example of the type of assembly which might be used on an industrial scale with electrodes in accordance with the present invention is wherein there is provided an atmospheric pressure plasma assembly comprising a first and second pair of parallel spaced-apart electrodes in accordance with the present invention, the spacing between inner plates of each pair of electrodes forming a first and second plasma zone wherein the assembly further comprises a means of transporting a substrate successively through said first and second plasma zones and an atomiser adapted to introduce an atomised liquid or solid coating making material into one of said first or second plasma zones. The basic concept for such equipment is described in the applicant's co-pending application WO 03/086031 which was published after the priority date of the present invention and which is incorporated herein by reference.

In a preferred embodiment, the electrodes are vertically arrayed.

As has been previously described herein one major advantage of the use of liquids for conducting materials is that each pair of electrodes can have a different amount of liquid present in each electrode resulting in a different sized plasma zone and therefore, path length and as such potentially a different reaction time for a substrate when it passes between the different pairs of electrodes. This might mean that the period of reaction time for a cleaning process in the first plasma zone may be different from path length and/or reaction time in the second plasma zone when a coating is being applied onto the substrate and the only action involved in varying these is the introduction of differing amounts of conducting liquid into the differing pairs of electrodes. Preferably, the same amount of liquid is used in each electrode of an electrode pair where both electrodes are as hereinbefore described.

The electrodes of the present invention may be used in any appropriate plasma system such as for example pulsed plasma systems but are particularly envisaged for use in plasma glow discharge and or dielectric barrier discharge assemblies, which may be operated at any suitable pressure. In particular they may be integrated into a low pressure or atmospheric pressure glow discharge assemblies particularly those of a non-thermal equilibrium type, and is most preferably for use with atmospheric pressure systems.

The process gas for use in plasma treatment processes using the electrodes of the present invention may be any suitable gas but is preferably an inert gas or inert gas based mixture such as, for example helium, a mixture of helium and argon, an argon based mixture additionally containing ketones and/or related compounds. These process gases may be utilized alone or in combination with potentially reactive gases for example, oxidising and reducing gases such as nitrogen, ammonia, ozone, $O_2$, $H_2O$, $NO_2$, air or hydrogen. However, the process gas may substantially comprise one or more of said potentially reactive gases. Most preferably, the process gas will be Helium alone or in combination with an oxidizing or reducing gas. The selection of gas depends upon the plasma processes to be undertaken. When a potentially reactive gas such as an oxidizing or reducing process gas is required in combination with either helium or any other inert gas or inert gas based mixture it will preferably be utilized in a mixture comprising 90-99% inert gas or inert gas mixture and 1 to 10% oxidizing or reducing gas.

Under oxidising conditions, the present method may be used to form an oxygen containing coating on the substrate. For example, silica-based coatings can be formed on the substrate surface from atomised silicon-containing coating-forming materials. Under reducing conditions, the assembly in accordance with the present invention may be used to provide a substrate with oxygen free coatings, for example, silicon carbide based coatings may be formed from atomised silicon containing coating forming materials.

In a nitrogen containing atmosphere, nitrogen can bind to the substrate surface, and in an atmosphere containing both nitrogen and oxygen, nitrates can bind to and/or form on the substrate surface. Such gases may also be used to pre-treat the substrate surface before exposure to a coating forming substance. For example, oxygen containing plasma treatment of the substrate may provide improved adhesion with to a subsequently applied coating. The oxygen containing plasma being generated by introducing oxygen containing materials to the plasma such as oxygen gas or water.

A wide variety of plasma treatments are currently available, those of particular importance to the electrodes of present invention include surface activation, surface cleaning, material etching and coating applications. A substrate may be activated and/or treated with any appropriate combination of the above by passing through a series of plasma zones, actuated by a series of plasma systems at least one of which containing one or more pairs of electrodes in accordance with the invention providing the required additional ingredients etc. are available in the respective plasma zones. For example, in the case of a substrate passing through a series of plasma zones, the substrate may be cleaned and/or activated in a first plasma zone, surface activated in a second plasma zone and coated or etched and in a third plasma zone.

Alternatively the first plasma zone may be utilised to clean and/or activate the surface of the substrate by plasma treating using a helium gas plasma and the second plasma zone is utilised to apply a coating of a precursor material, for example, by application of a gas precursor or a liquid or solid spray precursor through an atomiser or nebuliser as described in the applicants co-pending patent application WO 02/028548. As a still further alternative, the first plasma zone might be utilised as a means of oxidation (in for example, an oxygen/helium process gas) or the application of coating and the second plasma zone is utilised to apply a second coating using a different precursor. As an example having a pre-treatment and post-treatment step is the following process adapted for the preparation of a SiOx barrier with a soil/fuel resistant outer surface which may be utilised for solar cells or in auto applications in which the substrate is first pretreated by helium cleaning/activation of substrate, followed by deposition of SiOx from a polydimethylsiloxane precursor in the first plasma zone. Further helium plasma treatment to provide extra crosslinking of the SiOx layer and finally applying a coating utilizing a perfluorinated precursor. Any appropriate pre-treatments may be undertaken for example the substrate may be washed, dried, cleaned or gas purged using the process gas for example helium.

In a still further embodiment where a substrate is to be coated rather than having a multiple series of plasma assemblies a single plasma assembly may be utilised with a means for varying the materials passing through the plasma zone formed between the electrodes. For example, initially the only substance passing through the plasma zone might be the process gas such as helium which is excited by the application of the potential between the electrodes to form a plasma zone. The resulting helium plasma may be utilised to clean and/or activate the substrate which is passed through or relative to the plasma zone. Then one or more coating forming precursor material(s) may be introduced and are excited by passing through the plasma zone and treating the substrate. The substrate may be moved through or relative to the plasma zone on a plurality of occasions to effect a multiple layering and where appropriate the composition of the coating forming precursor material(s) may be varied by replacing, adding or stopping the introduction of one or more for example introducing one or more coating forming precursor material(s) such as reactive gas or liquids and or solids.

In the case where the system is being used to coat a substrate with a precursor material, the coating-forming precursor material may be atomised using any conventional means, for example an ultrasonic nozzle. The atomiser preferably produces a coating-forming material drop size of from 10 to 100 μm, more preferably from 10 to 50 μm. Suitable atomisers for use in the present invention are ultrasonic nozzles from Sono-Tek Corporation, Milton, N.Y., USA or Lechler GmbH of Metzingen Germany. The apparatus of the present invention may include a plurality of atomisers, which may be of particular utility, for example, where the apparatus is to be used to form a copolymer coating on a substrate from two different coating-forming materials, where the monomers are immiscible or are in different phases, e.g. the first is a solid and the second is gaseous or liquid.

It is to be understood that the substrate and plasma zones may move relative to each other, i.e. a substrate may physically pass between adjacent electrode pairs, may pass adjacent to electrode pairs, providing said substrate passes through the plasma zone effected by that pair of electrodes in combination with the process gas being utilised. In the latter instance, it is also to be understood that the plasma zone and substrate move relative to each other i.e. the electrode assembly move across a fixed substrate or the substrate may move relative to a fixed electrode system. In a further embodiment, the electrode system may be remote from the substrate such that the substrate is coated by excited species which have passed through a plasma zone but is not necessarily affected by the plasma.

In the case where the electrodes of the present invention are incorporated in an assembly suitable for coating substrates. The type of coating which is formed on the substrate is determined by the coating-forming precursor material(s) used. The coating-forming precursor material may be organic or inorganic, solid, liquid or gaseous, or mixtures thereof. Suitable organic coating-forming precursor materials include carboxylates, methacrylates, acrylates, styrenes, methacrylonitriles, alkenes and dienes, for example methyl methacrylate, ethyl methacrylate, propyl methacrylate, butyl methacrylate, and other alkyl methacrylates, and the corresponding acrylates, including organofunctional methacrylates and acrylates, including glycidyl methacrylate, trimethoxysilyl propyl methacrylate, allyl methacrylate, hydroxyethyl methacrylate, hydroxypropyl methacrylate, dialkylaminoalkyl methacrylates, and fluoroalkyl (meth)acrylates, methacrylic acid, acrylic acid, fumaric acid and esters, itaconic acid (and esters), maleic anhydride, styrene, α-methylstyrene, halogenated alkenes, for example, vinyl halides, such as vinyl chlorides and vinyl fluorides, and fluorinated alkenes, for example perfluoroalkenes, acrylonitrile, methacrylonitrile, ethylene, propylene, allyl amine, vinylidene halides, butadienes, acrylamide, such as N-isopropylacrylamide, methacrylamide, epoxy compounds, for example glycidoxypropyltrimethoxysilane, glycidol, styrene oxide, butadiene monoxide, ethyleneglycol diglycidylether, glycidyl methacrylate, bisphenol A diglycidylether (and its oligomers), vinylcyclohexene oxide and polyethylene oxide based polymers. Conductive polymers such as pyrrole and thiophene and their derivatives, and phosphorus-containing compounds, for example dimethylallylphosphonate might also be used. Suitable inorganic coating-forming materials include metals and metal oxides, including colloidal metals. Organometallic compounds may also be suitable coating-forming materials, including metal alkoxides such as titanates, tin alkoxides, zirconates and alkoxides of germanium and erbium.

Substrates may alternatively be provided with silica- or siloxane-based coatings using coating-forming compositions comprising silicon-containing materials. Suitable silicon-containing materials include but are not restricted to silanes (for example, silane, alkylsilanes alkylhalosilanes, alkoxysilanes, epoxysilanes and or aminofunctional silanes) and linear (for example, polydimethylsiloxane) and cyclic siloxanes (for example, octamethylcyclotetrasiloxane), including organo-functional linear and cyclic siloxanes (for example, Si—H containing, halo-functional, epoxy-functional, amino-functional and haloalkyl-functional linear and cyclic siloxanes, e.g. tetramethylcyclotetrasiloxane and tri(nonofluorobutyl)trimethylcyclotrisiloxane). A mixture of different silicon-containing materials may be used, for example to tailor the physical properties of the substrate coating for a specified need (e.g. thermal properties, optical properties, such as refractive index, and viscoelastic properties).

The substrate to be coated may comprise any material, sufficiently flexible to be transported through the assembly as hereinbefore described, for example plastics for example thermoplastics such as polyolefins e.g. polyethylene, and polypropylene, polycarbonates, polyurethanes, polyvinyl chloride, polyesters (for example polyalkylene terephthalates, particularly polyethylene terephthalate), polymethacrylates (for example polymethylmethacrylate and polymers of hydroxyethylmethacrylate), polyepoxides, polysulphones, polyphenylenes, polyetherketones, polyimides, polyamides, polystyrenes, polydimethylsiloxanes, phenolic, epoxy and melamine-formaldehyde resins, and blends and copolymers thereof. Preferred organic polymeric materials are polyolefins, in particular polyethylene and polypropylene. Alternatively the substrate to be coated may be a thin metal foil made from, for example aluminium, copper, iron or steel or a metalised film. Whilst the substrate to be coated is preferably of the type described above the system of the present invention may additionally be used to treat rigid substrates such as glass, metal plates and ceramics and the like.

Substrates which may be treated by an assembly in accordance with the present invention may be in the form of synthetic and/or natural fibres, woven or non-woven fibres, powder, siloxane, fabrics, woven or non-woven fibres, natural fibres, synthetic fibres cellulosic material and powder or a blend of an organic polymeric material and a organosilicon-containing additive which is miscible or substantially non-miscible with the organic polymeric material as described in the applicants co-pending patent application WO 01/40359. The dimensions of the substrate are limited by the dimensions of the volume within which the atmospheric pressure plasma discharge is generated, i.e. the distance between the inner walls of the electrodes in accordance with the present invention. For typical plasma generating apparatus, the plasma is generated within a gap of from 3 to 50 mm, for example 5 to 25 mm. Thus, the present invention has particular utility for coating films, fibres and powders.

The generation of steady-state glow discharge plasma at atmospheric pressure is preferably obtained between adjacent electrodes which may be spaced up to 5 cm apart, dependent on the process gas used. The electrodes being radio frequency energised with a root mean square (rms) potential of 1 to 100 kV, preferably between 4 and 30 kV at 1 to 100 kHz, preferably at 15 to 40 kHz. The voltage used to form the plasma will typically be between 2.5 and 30 kVolts, most preferably between 2.5 and 10 kV however the actual value will depend on the chemistry/gas choice and plasma zone size between the electrodes.

Whilst the atmospheric pressure glow discharge assembly may operate at any suitable temperature, it preferably will operate at a temperature between room temperature (20° C.) and 70° C. and is typically utilized at a temperature in the region of 30 to 40° C.

Electrodes prepared in accordance with the present invention are simpler and cheaper to manufacture than designs incorporating metallic electrodes and cooling systems, such as described in the applicants co-pending PCT application WO02/35576. For example by removing the requirement for liquid flow over the face of the electrode as described in WO 02/35576, one can reduce the distance between inner and outer wall in the electrodes of the present invention thereby reducing the volume of conductive material required and so reducing weight of the assembly.

Electrodes in accordance with the present invention also reduce the complexities of ensuring perfect equidistance and parallelism between adjacent electrodes, which is a particular problem with plate like metal electrodes and furthermore may be using a dielectric which may be optically transparent allowing for easy plasma observation and diagnosis.

Furthermore such an assembly reduces the complexities of ensuring conformance of the electrode and dielectric materials at their interfaces, a further significant problem observed when using metal plate electrodes for similar applications.

The invention will be more clearly understood from the following description of several embodiments of the invention which are provided hereafter by way of example only with reference to the accompanying drawings:—

FIG. 1 is a view of an atmospheric pressure plasma system containing two non-metallic electrodes;

FIGS. 2, 3, 4, 5*a*, 5*b* and 5*c* are sectional views of alternative embodiments of the assembly as shown in FIG. 1;

Figure 9A:
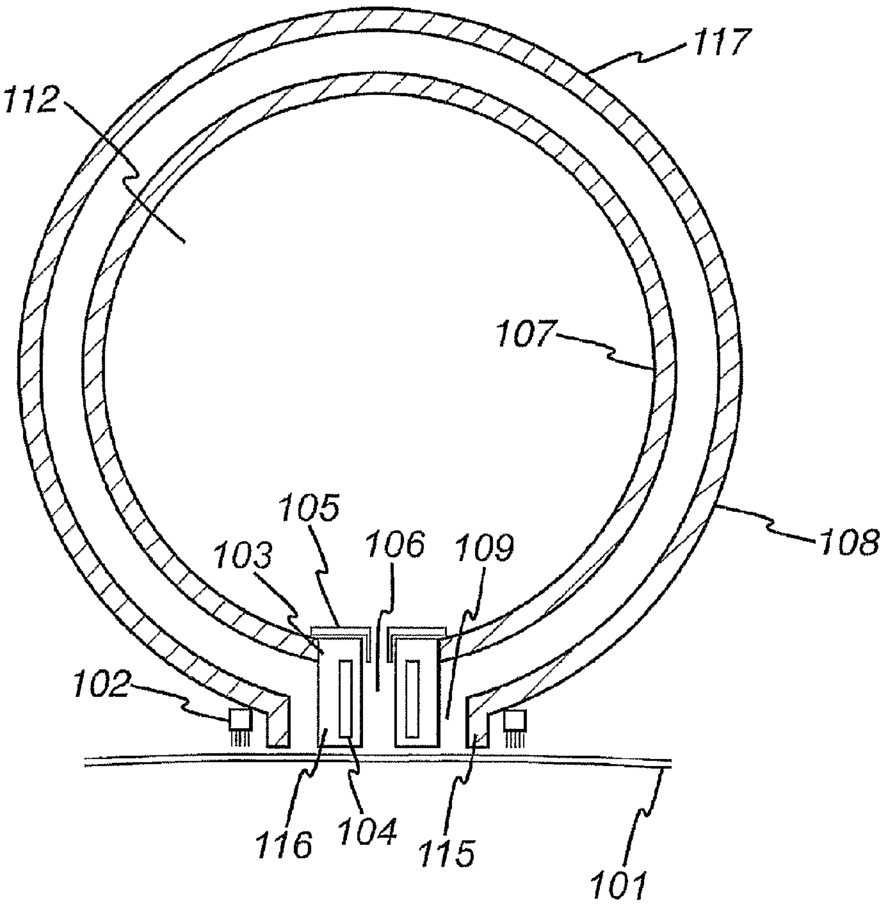
Figure 9B:
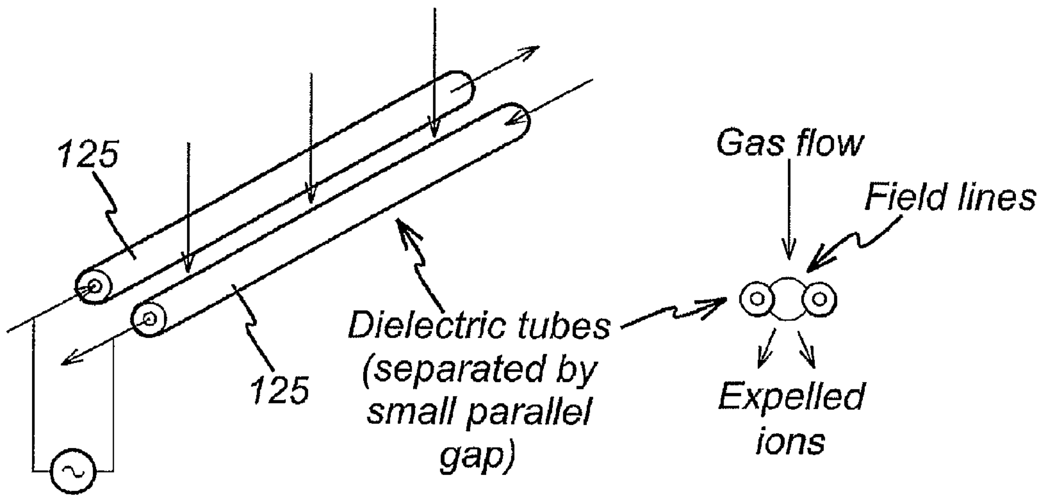

FIG. 9*a* is a sectional view of a still further alternative atmospheric pressure plasma assembly FIG. 9*b* is a plan view of a pair of dielectric tube electrodes for use in an atmospheric pressure plasma assembly of the type described in FIG. 9*a;*

Figure 11:
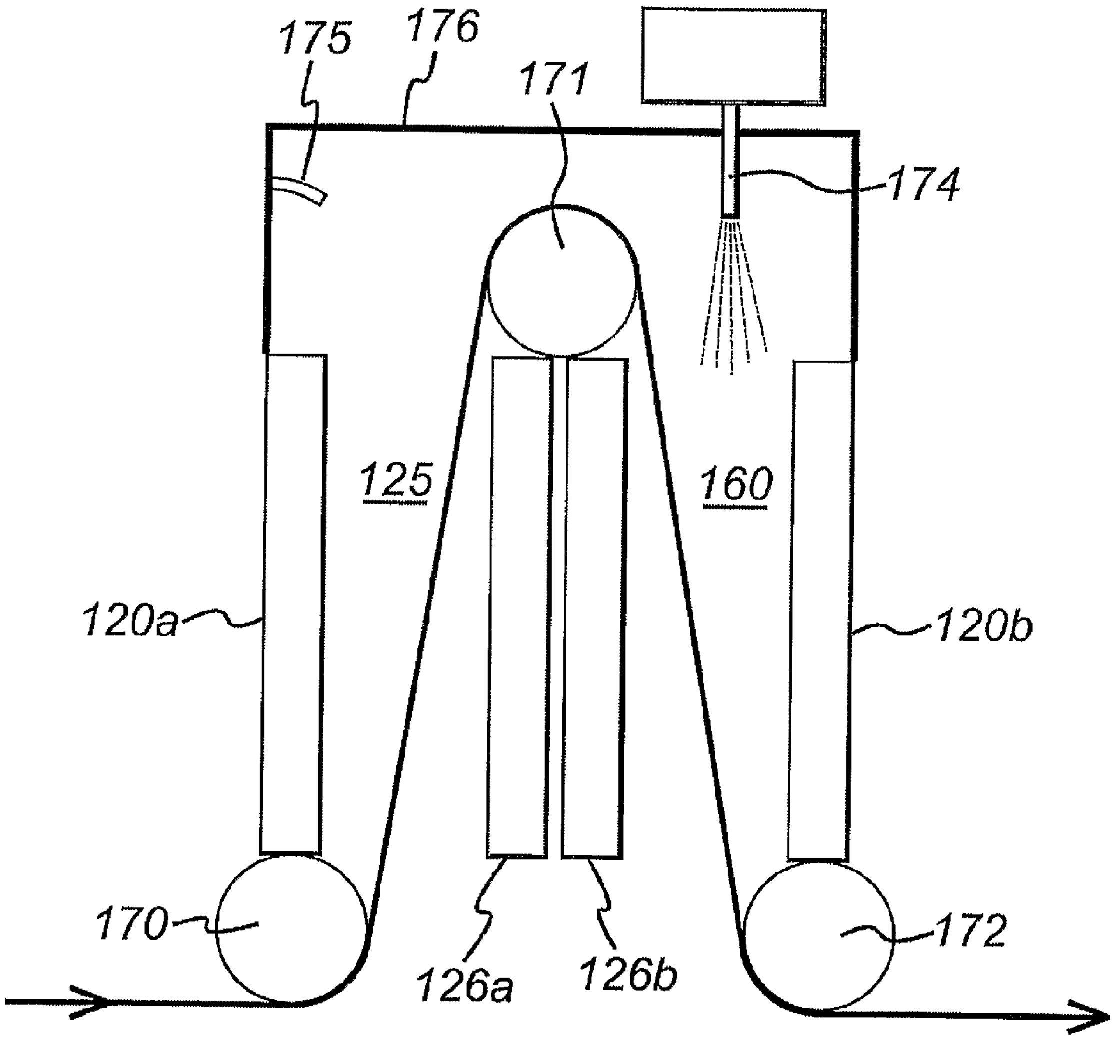
Figure 12:
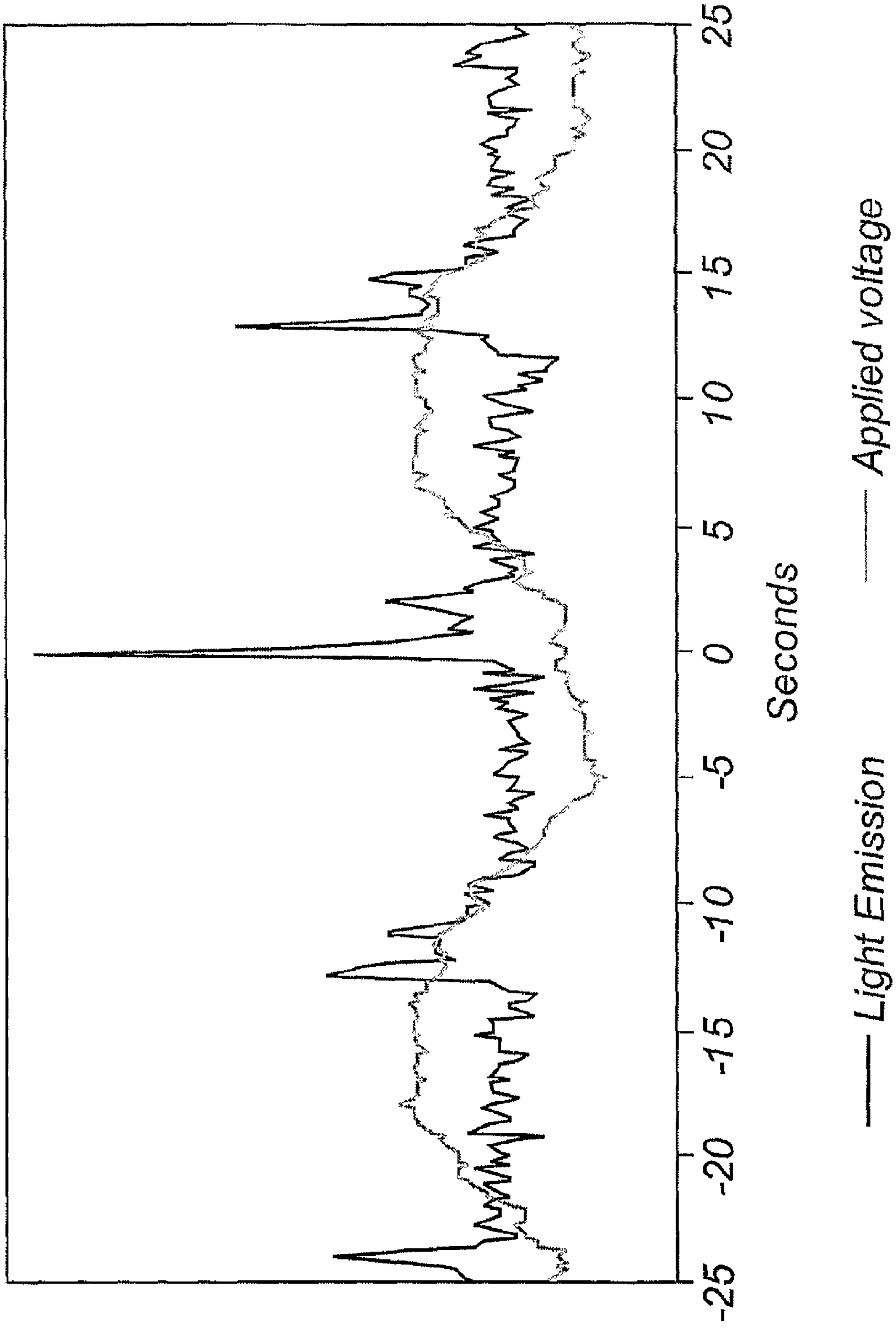

FIG. 10 is a view of flexible tubes which bound together in opposing voltage parallel pairs to which are formed into flat sheets and flexed to fit contoured surfaces;

FIG. 11 is a view of an assembly of the present invention for treating a substrate passing between pairs of electrodes; and FIG. 12 is a graph showing that the plasma produced is of a glow discharge type.

Referring to FIG. 1 there is provided an atmospheric pressure plasma assembly 1 having a pair of non-metallic electrodes indicated generally by the reference numeral 2. Each electrode 2 is in the form of a housing 20 and has a chamber 11, with an inlet 3 at one end thereof and an outlet 4 at the other end thereof through which, when present, a conductive salt solution may be introduced or removed. In the case of FIG. 1, the electrode is fully flooded with salt solution. The inlet 3 and outlet 4 both comprise a valve and these are utilised to control the introduction and removal of a conductive salt solution. Each electrode 2 has an inner wall 5 made of a dielectric material and an outer wall 6 which is made either from a dielectric material or from metal. Spacers 7 maintain adjacent ends of the electrodes 2 at a predefined distance apart. When in use, the gap 8 between the inner walls 5 of adjacent electrodes 2 forms a plasma zone 8. A power source 9 is connected to each inlet 3 by way of cables 10. The same numerals will be used for FIGS. 2 to 5*b*.

In use, valves 3*a* and 4*a* are opened and a conductive liquid is introduced into chamber 11 through inlet 3 of housing 20 and out through exit 4. The valves 3*a* and 4*a* are then closed off to prevent any further solution from being introduced or removed whilst the electrode system is in use. The liquid acts as both the conductive part of electrode 2, conforming in shape with the interface with both inner and outer walls 5, 6 and as a means of thermally managing the temperature of each electrode 2. The conductive liquid is cooled prior to introduction into chamber 11 by way of inlet 3 because the voltages utilized in the system the liquid may increase in temperature significantly whilst resident therein. Upon exiting the electrode via exit 4 the conductive liquid is directed to an external cooling means (not shown) and may then be reused for a future electrode system through reintroduction via inlet 3 should the need arise.

To initiate a plasma in plasma zone 8 an electrode potential is applied across the electrodes 2. Once an appropriate electrode potential has been applied across the electrodes 2, process gas, typically helium is passed through plasma zone 8 and is excited to faun a plasma. Each electrode 2 as seen in FIG. 1 produces a perfectly homogeneous electrical potential at its interface with inner wall 5 made of a dielectric material because of the liquid conformity and transverse conductivity at the interface between the conductive fluid and inner wall 5.

FIGS. 2 to 5 show a number of design alternatives to the embodiment seen in FIG. 1 These are particularly directed to minimize and preferably eliminate distortion of the inner wall 5 made from dielectric material, such as bending etc. due to the impact of internal pressures and provide alternative/additional means of cooling the electrode assemblies. These design alternatives are of particular use for electrodes having inner walls 5 with large surface areas, i.e. for systems having large plasma zones 8 such as, for example, plasma zones having a 1 $m^2$ or greater cross-sectional area.

In FIG. 2 each electrode 2 is segmented by the use of support ribs 15 which substantially divide housing 20 into two sections 22, 23. Support ribs 15 are attached to the inner and outer walls 5,6 and provision for electrical continuity is maintained by the presence of continuous conductive liquid pathways 18 between the sections. By securing the inner and outer walls 5, 6 to support ribs 15, the area over which maximum pressure is exerted is reduced, thereby reducing forces, which potentially could cause the distortion. The "segmented" electrode of FIG. 2 offers the additional advantage of variable path length, if each segment operates as an individual electrode, the path length of the plasma zone may be readily altered and optimised. In this instance the height of the conducting liquid in the electrode is controlled by operation of valves 3*a* and 4*a*. When the chamber 11,22,23 is full of conducting fluid as shown in FIG. 2 the conducting liquid is introduced through inlet 3*a* and removed through outlet 4*a* as described in relation to FIG. 1. However, when the path length is to be altered i.e. when chamber 11,22,23 is not full of conducting liquid, liquid is introduced and removed through inlet 3*a* and outlet 4*a* is utilised to prevent the formation of a vacuum in the air pocket in the region of chamber 11,22,23 which does not contain conducting liquid.

In a further embodiment as seen in FIG. 3 exit 4 (or inlet 3 (not shown) is used as both inlet and outlet and unless the electrode is fully flooded valve 4*a* is maintained in an open position to enable liquid release from chamber 11 due to temperature and/or pressure variations or the like when in use. In FIG. 3 a flat cooling plate 6*a* is used as the rear containment boundary in chamber 11 containing the conductive liquid, such that the conductive liquid is trapped between the dielectric surface of inner wall 5 and cooling plate 6*a*. Heat flows through this plate 6*a* from the internal conductive liquid to the external surface which is cooled by a secondary source which in the case of FIG. 3 for section 22 of chamber 11 is a chilled fluid such as water or air passing through cooling coil 25.

If the secondary cooling medium is a liquid i.e. a liquid passing through cooling coil 25 as shown in FIG. 3, then plate 6*a* is designed so that the pressure of the liquid in the cooling coil 25 does not distort plate 6*a* and transfer the pressure onto the conductive liquid in chamber 11 to cause unwanted distortion at on inner wall 5 and particularly the interface between the conductive liquid and inner wall 5 interface. A small degree of distortion in plate 6*a* can be accommodated in the conductive liquid by leaving a small portion 60 of the gap between inner wall 5 and plate 6*a* liquid free. Such a gap 60 may, for example, be sealed and evacuated or optionally filled with an unpressurised inert gas or air, or simply left open to the atmosphere. Distortions in plate 6*a* may then be accommodated as changes in height of the conductive liquid in chamber 11.

A further alternative process of heat removal is seen in FIG. 4 in which the flat cooling plate 6*a* has a finned external surface 30 which is cooled using either natural or forced convection, e.g. in the latter case a cooling fluid, typically air, is directed (blown) onto the fins 30 and plate 6*a* to cool the electrodes.

In use, as conductive liquid is retained or substantially retained within each electrode electrical connections must be within that electrode 2 and not in approach piping as may be the case for flow through systems. This is achieved most effectively by applying the electrode potential through plate 6*a* (FIG. 3) which provides an excellent means to deliver charge to the conductive liquid in chamber 11. In FIG. 3 therefore it could be said that electrode 2 is a composite electrode with a metallic plate 6*a*, and conductive liquid 11 forming a composite electrode. Furthermore, plate 6*a* forms a constraining surface for the conductive liquid in chamber 11 and is designed so as to provide structural integrity to the electrode assembly 2.

For designs in which the heat is extracted from the conductive liquid through plate 6*a*, and not through an internal cooling coil the thickness (distance d) of the conductive liquid can be reduced to further reduce weight within assembly 2. The distance d (FIG. 1) between plate 6 and inner wall 5, i.e. the thickness of the conductive liquid layer is, for electrodes as shown in FIGS. 1 and 2, typically in the range of 5 to 45 mm and preferably between 5 and 30 mm. However, such thicknesses are only restricted by the ability of the liquid to diffuse local electrical anomalies at the surface of the outer wall 6 across the face of the plate 6 such that a homogeneous charge is delivered to the inner wall 5. In practice, therefore distance d may even be under 1 mm for conductive liquids made from concentrated salt solutions, with the avoidance of cooling systems in chamber 11. In electrodes having smaller values of d (<10 mm), such as potentially those shown in FIGS. 3 and 4, the conductive liquids utilised experience capillary forces that have the effect of drawing the liquid into gap 60 resulting in a marked drop in the hydrostatic head within the conductive liquid. This drop in hydrostatic head reduces the force applied to the inner wall 5 and so reduces the distortion of the dielectric material used as the inner wall 5 due to the weight of the conductive liquid. The conductive liquid effectively becomes self-supporting which is beneficial in the construction of inner walls made from dielectric materials 5 having surface areas of greater than 1 $m^2$.

At small values of d (<10 mm) the convective portion of heat transfer from the dielectric material of inner wall 5 to plate 6, or 6*a* becomes negligible and thermal conduction dominates. It would therefore be beneficial to optimise thermal conductivity of the electrically conductive liquid and, because liquid mobility in a non-flow composite electrode gap is no longer critical, the viscosity of the conductive liquid need no longer be a constraint. Mobility of the conductive liquid is only necessary to ensure conformity of the liquid with both the dielectric and metallic electrode surface.

All of the embodiments described in FIGS. 1 to 4 avoid the pressure build up resulting from the need to pump a liquid through the electrodes as described in the prior art. Removal of the pumping pressure from the system leaves only the hydrostatic head from the height of liquid contained within the assembly and as such reduces the likelihood of bowing of the electrode walls which will reduce the efficiency of the electrode system and its ability to produce a consistent plasma throughout the plasma zone.

Figure 5A:
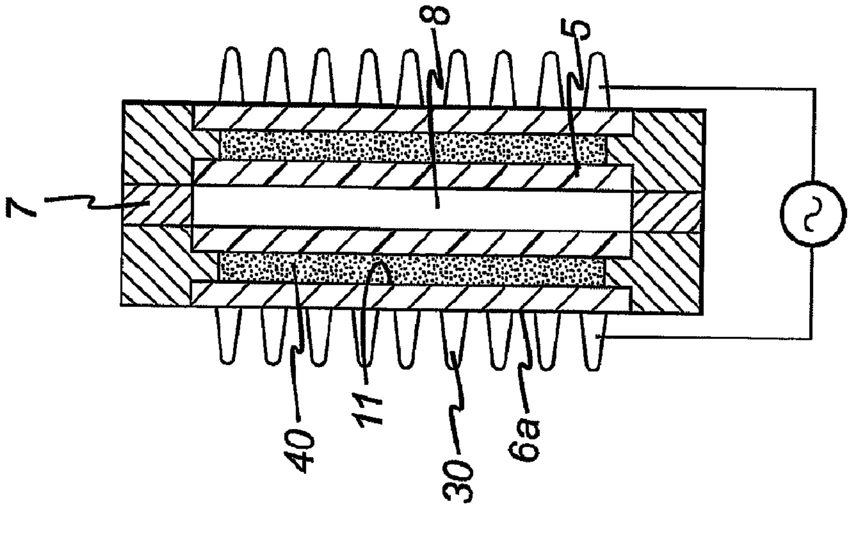
Figure 5B:
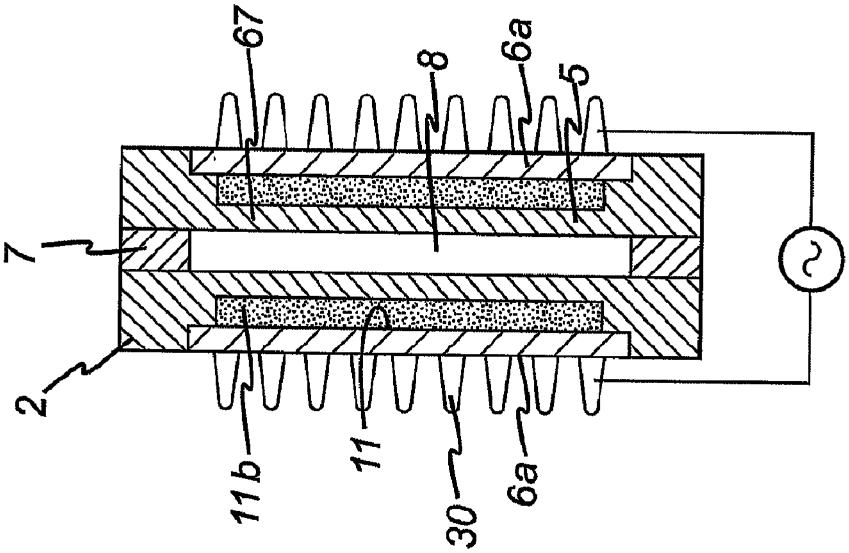

FIG. 5*a* shows an electrode assembly where the electrically conductive liquid previously used is replaced by an electrically and thermally conductive paste 40 in chamber 11 which affects both a homogeneous electric field and the efficient transport of heat from the inner wall 5 to the cooled plate 6*a* having cooling fins or the like 30. FIG. 5*b* shows an electrode assembly using a one piece dielectric 67, having a chamber 11*b*, which has been engineered out of the body of the dielectric 67. In this embodiment, the dielectric is adapted to receive plate 6*a* having cooling fins 30 and encase the electrically conductive liquid. Typically the dielectric material is hollowed out, with or without support ribs 15 which when present are formed by leaving un-hollowed sections. The dielectric material used is typically a sheet of engineering plastic (polyethylene, polypropylene, polycarbonate or proprietary materials such as PEEK) or engineering ceramics. Each electrode 2 may then be assembled with conductive liquid in chamber 11*b* and sealed with a finned 30, metallic plate 6*a* which may be cooled by air or chilled liquid. In the embodiment described in FIG. 5*b*, the electrically conductive material is usually a conductive liquid such as salt solution.

Figure 5C:
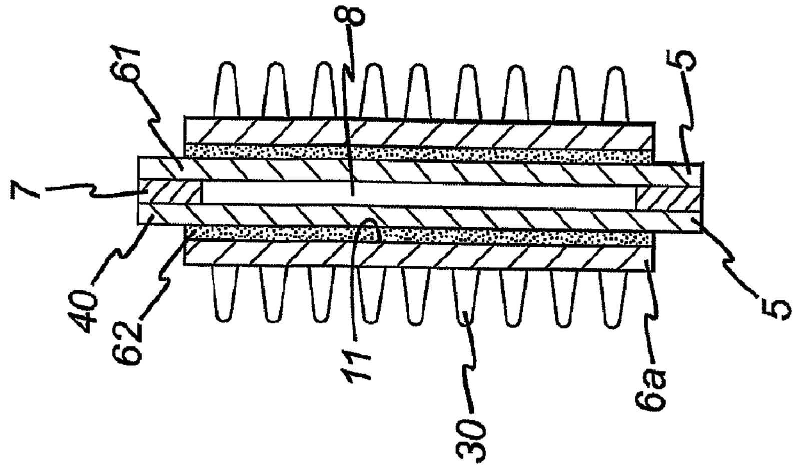

In FIG. 5*c* the need for the hollowed out chamber 11*b* can be avoided by replacing the conductive liquid with a suitable cured or uncured layer of electrically conductive paste 62 which is position between inner wall 5 and plate 6*a*. The paste can remain uncured, but preferably is cured to improve adhesion to both plate 6*a* and dielectric 61. Again plate 6*a* is either cooled by air or chilled liquid. In the embodiments described in FIGS. 5*a*, 5*b* and 5*c* the electrical potential is applied to metallic plate 6*a* and dispersed evenly to the rear face of the inner wall 5 through the conductive liquid and paste respectively in chamber 11.

Figure 6:
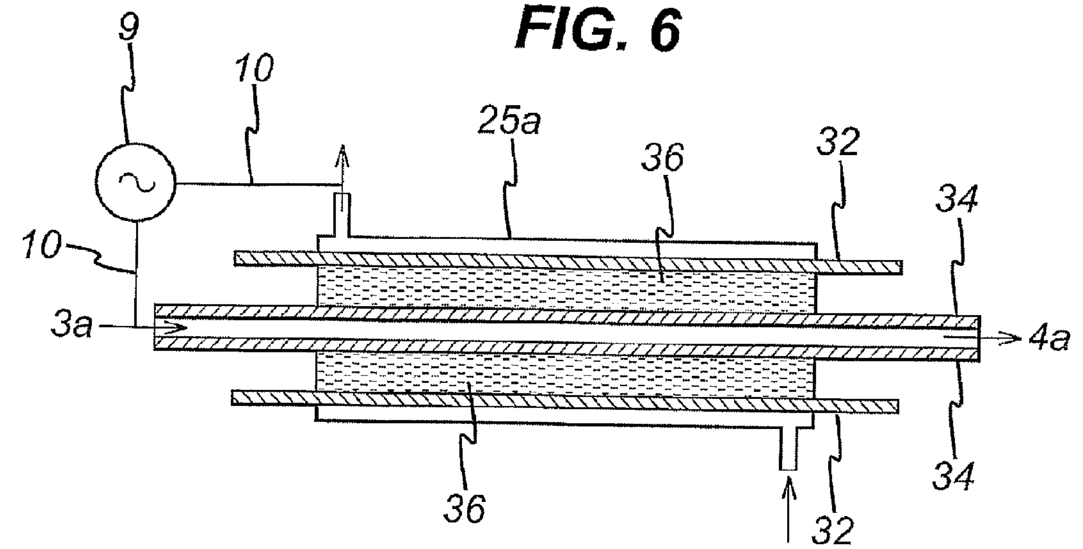
FIG. 6 is a sectional view of an atmospheric pressure plasma system whereby the electrodes are in the form of a concentric pipe.
Figure 7:
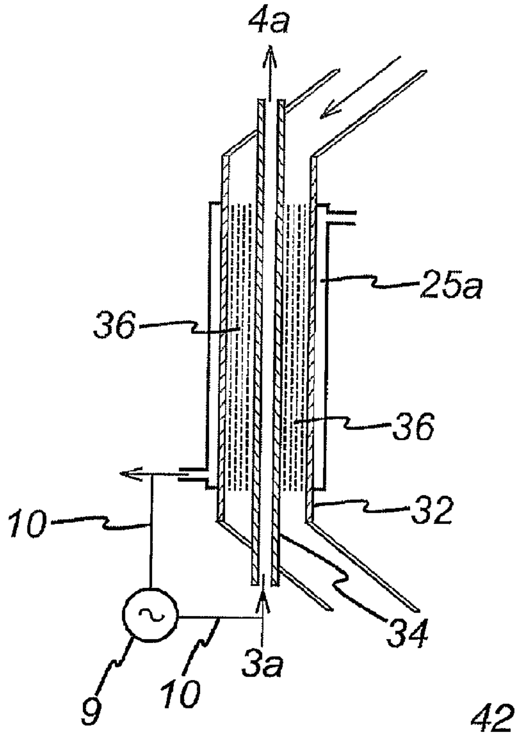
FIG. 7 is a sectional view of an atmospheric pressure plasma assembly of FIG. 6 adapted for plasma treating powders or liquids.

In a still further embodiment of the invention the conductive liquid is encased within the internal and external regions of a double concentric pipe arrangement as seen in FIGS. 6 and 7, wherein the gap between outer pipe 32 and the inner pipe 34 forms a plasma zone 36 which in use is generated between the pipes. This embodiment may be utilised to treat materials such as, gases, liquid aerosols, powders, fibres, flake, foams etc. that can be transported through such concentric pipe arrangements for plasma treatment. In the case of solid materials, such as powders, the pipe may for example be utilized in a substantially vertical position as seen in FIG. 7. In this embodiment as seen in FIGS. 6 and 7, a cooling liquid may be passed into, through and out of inner pipe 34 by way of inlet 3*a* and outlet 4*a* and an outer cooling coil 25*a* may be utilized to at least substantially surround outer pipe 32 to remove heat generated by effecting the plasma.

Figure 8:
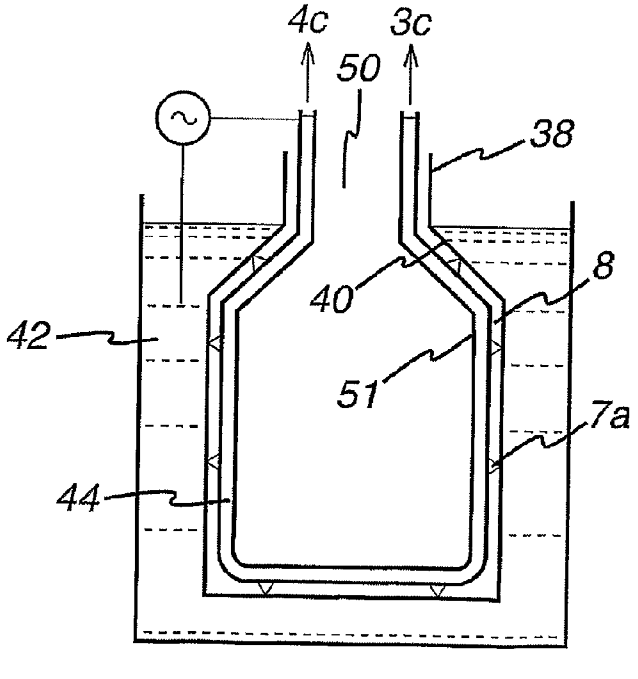
FIG. 8 is a sectional view of a further alternative atmospheric pressure plasma assembly.

In another embodiment of the present invention, as shown in FIG. 8, when it is required to plasma treat the inner surface 40 of a container 38, the said container 38 is partially submerged, in a bath of charged, conductive liquid 42. The liquid form of electrode ensures complete conformity of the outer electrode with complex surface topologies of container 38. Alternatively, a conformal mould might be made using a flexible dielectric membrane 44 or the like, kept in place by means of introduction of an inflating gas 50. The opposing potential could be supplied through an opposing electrode inside the container that would affect a plasma zone on the inner surface, the inner electrode having a dielectric coating to avoid localized discharges. Whilst the inner electrode may be a solid probe, it may also be conformal in nature so ensuring that local parallelism between potential surfaces is maintained thereby promoting the conditions for glow discharge plasmas. Alternatively, it may be a liquid electrode 51 having an inlet 3*c* and an outlet 4*c* for introducing and removing conductive liquid, into and out of the electrode 51 by way of valves (not shown). In such a case, the plasma zone 8 has its gap maintained through use of spacers 7*a*. Articles for treatment may be topologically open or partially closed (such as bottles or containers). In the case of partially closed objects, an inner conformal surface could be generated by an expanding balloon pressurized by the conductive liquid or by an introduced gas around which a skin of conductive liquid is held captive. Such a concept could be used in the plasma treatment of bottles or suchlike containers, whereby the bottle is partially submerged in a bath of conductive salt solution or, introduced into a flexible dielectric mould that is caused to pressurize and conform to the outer contours of the bottle surface, simultaneous with the expansion of an internal dielectric balloon to conform to the inner surface, the inner and outer liquid electrodes being of opposing polarity.

In a still further embodiment of the present invention depicted in FIG. 9*a* there is provided an atmospheric plasma assembly 100, comprising an atmospheric plasma generation unit 107 which has a substantially cylindrical body 117 having a substantially circular cross-section which contains a process gas inlet (not shown) for introducing a process gas which is used to effect the plasma, an ultrasonic nozzle (not shown) for introducing an atomised liquid and/or solid coating-forming material and a pair of liquid containing electrodes 104 both of which are contain a conductive liquid in a housing made from a dielectric material 103. The electrodes are maintained at a predetermined distance apart by means of a pair of electrode spacers 105. The electrodes 103, 104 project outwardly from the atmospheric plasma generation unit 107. The gap between the electrodes forms a plasma zone 106. The atmospheric plasma generation unit 107 may be designed such that the only exit for a process gas and reactive agent introduced into the unit 107 is able to pass through the plasma zone 106 between dielectric coated electrodes 103, 104. The atmospheric plasma generation unit 107 is fixed in place and a substrate 101 passes beneath the assembly on any form of conveying means (not shown) which may be varied to suit the substrate being treated in view of the fact that the conveyor does not form part of the assembly.

Extractor unit 108, like atmospheric pressure generation unit 107 is generally cylindrical with a substantially circular cross-section and is made of a dielectric material such as polypropylene or PVC. Units 107 and 108 are concentric with extractor unit 108 having a larger diameter. Extractor unit 108 comprises a lip 115 which surrounds the electrodes 103, 104 and forms a channel 109 between them through which residual process gas, reactant and by-product is extracted. The end of the lip 116 is designed to be equidistant from substrate 1 as is the base of the electrodes 103, 104 but can be closer. Extractor 108 also comprises an outlet to a pump (not shown) which is used to extract the residual process gas, reactive agent and by-products from the assembly. Conditioning bars 102 are provided external to lips 116 to minimalise the ingress of air from the atmosphere into the extraction unit109 they are either lip seals touching substrate 101 or dependent on the substrate being treated they may also be anti-static bars as used in the plastic film industry which remove static from the surface of the substrate using high static potential and optionally use air jets to remove dust particulates or antistatic carbon brushes.

Electrodes of the present invention may be utilized to form a narrow plasma zone between adjacent conductive liquid channels in electrodes 103,104 created by reducing the dielectric faces of a parallel plate assembly down to a small height (FIG. 9*a*), or more simply, forming opposed electrode pairs from two non-conductive, dielectric tubes placed side by side and spaced equally apart down their lengths (FIG. 9*b*). Plasma gases within this intertube region are removed by way of extractor unit 108. This metal free electrode design provides a more homogeneous electric field between the electrodes by eliminating any surface roughness which will lead to micro-discharges across the narrow gap.

A still further embodiment (FIG. 10) of the present invention is to retain a conductive liquid through flexible tubes which could be bound together in opposing voltage parallel pairs 130, 132 and so formed into flat sheets that could be flexed to fit contoured surfaces as shown in FIG. 10. The electric field between alternating voltage tubes extends both above and below the sheets such that a plasma zone could be formed in these areas in the presence of suitable process gas compositions as known in the industry. Sheets so formed could be wrapped around the surface of contoured objects. This would be particularly useful for treatment of partial surfaces or large, bulky objects that cannot easily be passed through conventional atmospheric plasma treatment systems. An alternative arrangement would be to wind opposing voltage tubes together as a spiral wound pair that could be formed into a wide diameter tube. A plasma zone could be generated on both the outer, but more usefully, the inner surface of this wound tube to cater for the treatment of thin walled tubes or bottles.

EXAMPLE

An example of the use of the electrodes of the present invention in an atmospheric pressure glow discharge system is described below with reference to FIGS. 11 and 12 and Table 1.

FIG. 11 depicts how a flexible substrate is plasma treated using an assembly of the type described in the applicant's co-pending patent application WO 03/086031 incorporating the electrodes of the present invention. Each electrode pair is of the type described in FIG. 5*b* above and is 1.2 m wide and 1 m long and contains a brine solution (2% by weight of sodium chloride) having an approximate thickness (d) of 24 mm between inner wall 67 and back wall 6*a* (FIG. 5*b*). A means of transporting a substrate through the assembly is provided in the form of guide rollers 170, 171 and 172. A process gas inlet 175, an assembly lid 176 and an ultrasonic nozzle 174 for introducing an atomised liquid into plasma zone 160 are provided. The process gas inlet 175 may alternatively be situated in the assembly lid 176 instead of the side as shown in FIG. 11)

In use a flexible substrate is transported to and over guide roller 170 and is thereby guided through plasma zone 125 between brine electrodes 120*a* and 126*a*. The plasma in the plasma zone 125 is a cleaning helium plasma, i.e. no reactive agent is directed into plasma zone 125. The helium is introduced into the system by way of inlet 175. Lid 176 is placed over the top of the system to prevent the escape of helium as it is lighter than air. Upon leaving plasma zone 125 the plasma cleaned substrate passes over guide 171 and is directed down through plasma zone 160, between electrodes 126*b* and 120*b* and over roller 172 and then may pass to further units of the same type for further treatment. However, plasma zone 160 generates a coating for the substrate by means of the introduction of a reactive precursor. The reactive precursor may comprise gaseous, liquid and/or solid coating making material, but are preferably liquid and solid coating making materials introduced in a liquid or solid form through nebuliser 174. An important aspect of the fact that the reactive agent being coated is a liquid or solid is that said atomised liquid or solid travels under gravity through plasma zone 160 and is kept separate from plasma zone 125 and as such no coating occurs in plasma zone 125. The substrate to be coated then passes through plasma zone 160 and is coated and transported over roller 172 and is subsequently collected or further treated with, for example, additional plasma treatments.

Atomised liquid precursor is introduced into plasma zone, 160 from nebuliser 174 which in the case of a liquid, generates a mist of precursor droplets. The precursor droplets interact with the plasma and substrate to generate a coating whose chemical structure is directly and closely related to the precursor. The nebuliser 174 is ultrasonically activated and liquid flow is controlled using liquid mass flow controllers (MFCs). The plasma is generated by applying a large electrical potential across the gap between adjacent pairs of electrodes. A high voltage was supplied to the electrodes from a variable frequency generator with a high voltage transformer on the output. Maximum power from this generator is 10 kW with a maximum voltage of 4 kV RMS (root mean square) and a frequency in the range 10-100 kHz. Electrical measurements recorded during processing were obtained from the generator itself and from voltage and current probes mounted on the electrodes. Each electrode was 1.2 m wide and 1 m long. High pressure air knives are employed to cool the back walls of the electrode in conjunction with the cooling fins to ensure that the electrode temperatures are maintained below 80° C.

Glow Discharge Behaviour

Dielectric barrier discharges exist as either filamentary or glow discharges. Filamentary discharges occur when local non-uniformities in either electric field potential or charge densities cause the ionisation of the gas to become localized and lead to a highly concentrated current discharge over a very short time span (in the region of approximately 2-5 nanoseconds duration). These types of discharges can produce non-uniform coatings or damage the substrates due to the locally intense nature of the filamentary discharges. The choice of electrodes in accordance with the present invention in combination with suitable electrode geometries, gas compositions and power/frequency conditions ensure that atmospheric pressure dielectric barrier discharges can occur in glow discharge modes where the plasma is formed uniformly across the width of the electrodes. This leads to a current discharge which is much longer than the filamentary discharge with a duration of 2-10 microseconds which results in the formation of significantly more uniform coatings.

In the present example the current discharge in the atmospheric pressure assembly was followed by tracking and measuring. The light emitted from the plasma using high speed photodiodes. FIG. 12 shows the photodiode output resulting from the plasma under the following conditions; 1000 W, 10 liters per minute helium. The output shows current peaks of duration between 1 and 3 which is clearly indicative of a glow discharge mode of operation.

Hydrophobic Coatings

The apparatus as described above was utilized in combination with tetramethylcyclotetrasiloxane which was deposited onto a polyethylene terephthalate (PET) non-woven substrate surface when passing through plasma zone 160. The PET was extremely hydrophilic before treatment.

Hydrophobic response was measured post-treatment using probe solutions with different concentrations of isopropyl alcohol (IPA) in water. Using total precursor flow rates of approximately 400-1000 μl/min, powers between 5 and 9 kW and substrate speeds of between 2 and 10 m/min, hydrophobic responses of up to level 5 on the scale were achieved, with no adverse effect on any other physical properties of the substrate.

TABLE 1

Scale used to measure hydrophobic response of PET substrates

| Probe Liquid | Hydrophobic Scale |
|---|---|
| Water | 1 |
| 98% H2O/2% IPA | 2 |
| 95% H20/5% IPA | 3 |
| 90% H20/10% IPA | 4 |
| 80% H20 /20% IPA | 5 |

The invention claimed is:

1. A method of utilizing a plasma discharge generating assembly (1) comprising at least one pair of substantially equidistant spaced apart electrodes (2), the spacing between the electrodes being adapted to form a plasma zone (8) upon the introduction of a process gas and upon effecting a plasma between the electrodes and enabling passage, where required, of gaseous, liquid and/or solid precursor(s) wherein at least one of the electrodes (2) comprises a housing (20) having an inner wall (5) and an outer (6) wall, wherein the inner wall (5) is formed from a non-porous dielectric material, and which housing (20) substantially retains an at least substantially non-metallic electrically conductive material selected from the group of liquid and/or conductive polymer paste, the housing (20) having an inlet (3) to enable introduction and, optionally, removal of the non-metallic electrically conductive material, said method comprising the steps of:

introducing a process gas into the spacing between the electrodes (2);

effecting the plasma between the electrodes (2) to form the plasma zone (8); and varying a functional size of each electrode (2) that comprises the housing (20) by the introduction and removal of the at least substantially non-metallic electrically conductive material in the housing (20) thereby varying the plasma zone (8).

2. A method in accordance with claim 1 wherein the at least one pair of electrodes (2) is further defined as a plurality of pairs of electrodes (2).

3. A method in accordance with claim 1 wherein the at least substantially non-metallic electrically conductive material is a polar solvent.

4. A method in accordance with claim 3 wherein the polar solvent is water, an alcohol and/or glycol.

5. A method in accordance with claim 3 wherein the at least substantially non-metallic electrically conductive material is a salt solution.

6. A method in accordance with claim 1 wherein the at least substantially non-metallic electrically conductive material is the conductive polymer paste.

7. A method in accordance with claim 6 wherein the conductive polymer paste is curable.

8. A method in accordance with claim 1 wherein each housing (20) further comprises an outlet (4) and wherein the at least substantially non-metallic electrically conductive material is introduced into and removed from the electrode (2) by way of the inlet (3) and outlet (4).

9. A method in accordance with claim 1 wherein the outer wall (6) is a heat sink.

10. A method in accordance with claim 8 wherein one or more cooling coils (25) or cooling fins (30) is/are fixed to the outer wall (6,6*a*) to cool the at least substantially non-metallic electrically conductive material and assembly (1).

11. A method in accordance with claim 1 wherein the electrodes (2) are in the form of concentric cylinders (32, 34).

12. A method in accordance with claim 1 wherein each electrode (2) is cuboidal and is made from a single section of dielectric material (67) apart from the outer wall (6,6*a*) and each electrode (2) has a chamber (11*b*) defined within the dielectric material (67) for receiving the at least substantially non-metallic electrically conductive material.

13. A method in accordance with claim 1 wherein the plasma discharge generating assembly (1) further comprises a means of transporting a substrate (170,171,172) through the plasma zones (8).

14. A method in accordance with claim 1 further comprising the step of treating films, webs, non-woven and woven fabrics and/or metal foils in the plasma zone.

15. A method in accordance with claim 1 further comprising the step of treating powders and particulate materials in the plasma zone.

16. A method of utilizing a pair of substantially equidistant spaced apart electrodes (2), wherein at least one of the electrodes (2) comprises a housing (20) having an inner wall (5) and an outer (6) wall apart from the inner wall (5), wherein the inner wall (5) is formed from a non-porous dielectric material, and which housing (20) substantially retains an at least substantially non-metallic electrically conductive material, the housing (20) having an inlet (3) to enable introduction and, optionally, removal of the non-metallic electrically conductive material selected from the group of liquid and/or conductive polymer paste, said method comprising the steps of effecting a plasma between the electrodes (2) to form a plasma zone (8) and varying a functional size of each electrode (2) that comprises the housing (20) by the introduction and removal of the non-metallic electrically conductive material in the housing (20) thereby varying the plasma zone (8) between the electrodes.

17. A method in accordance with claim 1 further comprising the step of passing a substrate through the plasma zone (8).

18. A method in accordance with claim 1 wherein the plasma discharge generating assembly is selected from the group of plasma glow discharge generating assemblies and dielectric barrier generating assemblies.

19. A method in accordance with claim 13 wherein the plasma discharge generating assembly further comprises an atomiser (74) and wherein the method further comprises the step of introducing gaseous or atomised liquid and/or solid coating making materials into the plasma zone (8) with the atomizer.

20. A method as set forth in claim 1 wherein the inlet comprises a valve (3*a*) and wherein the introduction and removal of the non-metallic electrically conductive material in the housing is controlled by operation of the valve (3*a*).

21. A method as set forth in claim 1 wherein the electrodes (2) are vertically arrayed during the step of varying a functional size of each electrode (2).

22. A method as set forth in claim 1 wherein the non-metallic electrically conductive material is in direct contact with the inner (5) and outer (6) walls of the electrode (2).

23. A method as set forth in claim 1 wherein the housing (20) of the electrode (2) is segmented to substantially divide the housing (20) into two or more sections (22, 23) provided that electrical continuity is maintained between the sections (22, 23) by the presence of continuous conductive liquid pathways between the sections (22, 23).

24. A method as set forth in claim 1 wherein the housing (20) has a single unsegmented chamber (11) with the functional size of the electrode (2) varied with an amount of the electrically conductive material present in the single chamber (11).

* * * * *